United States Patent [19]

Yonemoto et al.

[11] Patent Number: 5,136,015

[45] Date of Patent: Aug. 4, 1992

[54] ADDITION TYPE IMIDE RESIN PREPOLYMER, MANUFACTURING METHOD THEREOF, PREPREG AND LAMINATE THEREOF

[75] Inventors: Tatsuo Yonemoto; Masahiro Matsumura; Yoshihisa Sugawa; Eiichiro Saito; Hiroshi Yamamoto; Keiko Kashihara, all of Kadoma, Japan

[73] Assignee: Matsushita Electric Works, Ltd., Osaka, Japan

[21] Appl. No.: 506,956

[22] Filed: Apr. 10, 1990

[51] Int. Cl.$^5$ .............................................. C08G 73/12
[52] U.S. Cl. ............................... 528/315; 428/473.5; 525/422; 528/170; 528/171; 528/172; 528/179; 528/182; 528/313; 528/317; 528/318; 528/321; 528/322
[58] Field of Search ............... 428/473.5; 528/170, 528/321, 322, 179, 182, 313, 315, 317, 318; 525/422

[56] References Cited

U.S. PATENT DOCUMENTS 3,899,626 8/1975 Steffen ............................. 428/474
4,598,115 7/1986 Fujioka et al. ..................... 524/376

FOREIGN PATENT DOCUMENTS 1245024 9/1989 Japan .

Primary Examiner—Paul J. Thibodeau
Assistant Examiner—D. S. Nakarani
Attorney, Agent, or Firm—Burns, Doane, Swecker & Mathis

[57] ABSTRACT

An addition type imide resin prepolymer is obtained by a reaction of unsaturated bisimide of 1.0 mol to diamine of 0.25 to 0.43 mol and an addition of polyamine having three or more benzene rings. The prepolymer is thereby made to contain substantially no unreacted diamine component which affects human body of operators, and to have remarkably excellent heat resistance and adhesive properties, while effective to restrain a production of any component of a molecular weight exceeding 15,000.

10 Claims, No Drawings

ADDITION TYPE IMIDE RESIN PREPOLYMER, MANUFACTURING METHOD THEREOF, PREPREG AND LAMINATE THEREOF

BACKGROUND OF THE INVENTION

This invention relates to an addition type imide resin prepolymer, a method for manufacturing the addition type imide resin, a prepreg formed by the addition type imide resin and an addition type polyimide laminate formed by laminating and setting a plurality of such prepregs.

The addition type polyimide laminate of the kind referred to is effectively utilizable in preparing printed wiring boards, in particular, multilayered wiring substrates for high density packaging and so on.

1. Field of the Invention

In recent years, the addition type polyimide prepolymer obtained by a reaction of unsaturated bisimide to diamine has been widely used as a resin material for manufacturing the multilayered wiring substrates. The addition type polyimide prepolymers of the kind referred to have been disclosed in U.S. Pat. No. 3,899,626 of J. Steffen, and Japanese Patent Application Laid-Open Publications Nos. 56-28215, 60-13812, 60-72933 and 60-21064, and they show such advantages as follows when employed in making the printed wiring boards:

a) Such high precision and microscopic working as dimensional minimization of wiring conductor for adaption to the high density mounting, fine perforation for making through holes, and so on is made possible.

b) Substantially no smear generation takes place during drilling work of the fine perforation for the through holes.

c) The prepolymers are high in the conductor adhesion and the hardness at higher temperatures and are excellent in the packaging properties.

d) The prepolymers are durable under continuous use at higher temperatures such as above 200° C.

It has been found, however, that the addition type imide resin prepolymer involves much unreacted diamine remained even at B stage, that is, even at the stage where the prepolymer is made to be the prepreg. The unreacted diamine, in particular, aromatic diamine having only two or less benzene rings is considered to be toxic to human bodies, and a remarkable reduction of such unreacted diamine in the prepolymer and its prepregs has been demanded since operators who handle the prepolymer and prepregs have to be directly exposed to the unreacted diamine. The residual unreacted diamine is also regarded as a cause of blisters occurring during the manufacture of the laminates, and the reduction is also desirous in view of this respect.

On the other hand, polyamine having three or more benzene rings is regarded substantially not toxic since such polyamine cannot pass through biologic cell membrane, but is deficient in the reactivity in general. No reaction proceeds, therefore, between such polyamine and bisimide and, even if the reaction would be forcibly tried to proceed, a homo polymer of bisimide is produced while polyamine remains unreacted. Eventually obtained laminate including such unreacted polyamine shows only inferior heat resistance and adhesive properties.

In reducing the remaining unreacted diamine in the addition type imide resin prepolymer, it will be only necessary to promote Michael's addition which is a main reaction in synthetic reaction of the prepolymer, but this will cause a composition of a molecular weight exceeding 15,000 to be produced as the reaction proceeds. The present inventors have separated such component of the molecular weight exceeding 15,000 out of the prepolymer obtained through the reaction of unsaturated bisimide to diamine, with a gel permeation chromatography employed, and subjected the separated component to a carbon-nuclear magnetic resonance analysis as solved in a heavy-hydrogenizing solvent, and it has been recognized that substantially no diamine component is found but the component substantially consists of a homo polymer of unsaturated bisimide. It has been known that this homo polymer is poor in the flexibility and in the adhesion with respect to base material for the prepreg. Accordingly, it is required that the component of the molecular weight exceeding 15,000 is restrained from being produced as far as possible in obtaining the addition type imide resin prepolymer so as not to impair its properties.

In addition, the substrate for use with the printed wiring has been also demanded to be high in the heat resistance in response to development in the more fine working or more complicated steps therefor in order to raise the mounting density for the substrate.

SUMMARY OF THE INVENTION

A primary object of the present invention is, therefore, to provide an addition type imide resin prepolymer which can remarkably reduce or substantially does not allow remains of unreacted diamine at the stage of prepolymer and prepreg, and is effectively applicable to the multilayered wiring substrate and so on which is sufficiently high in the heat resistance, excellent in the adhesive properties and capable of restraining the component of a molecular weight exceeding 15,000 from being produced.

According to the present invention, this object can be realized by an addition type imide resin prepolymer obtained through a reaction of such unsaturated bisimide as represented by a following general formula (I) to such diamine as represented by a following general formula (II) with polyamine added, characterized in that the reaction is carried out at a ratio of 1.0mol of unsaturated bisimide and 0.25 to 0.43mol of diamine, and polyamine added is one having at least three benzene rings, wherein

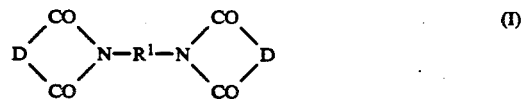

in which D denotes bivalent organic group including double bond between carbon-carbon, and $R^1$ denotes bivalent organic group containing at least two carbon atoms, and

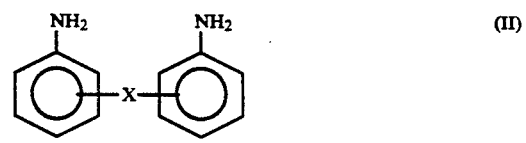

in which $X=CH_2$, O, S, or $SO_2$.

Other objects and advantages of the present invention shall be made clear in following description of the invention detailed with reference to preferred embodiments.

While the present invention shall now be described with reference to the various embodiments, it should be appreciated that the intention is not to limit the invention only to such embodiments but rather to include all modifications, alterations and equivalent arrangements possible within the scope appended claims.

DETAILED DESCRIPTION OF THE PREFERRED EMBODIMENTS

Referring first to the addition type imide resin prepolymer according to the present invention, this prepolymer is produced through a reaction of unsaturated bisimide on diamine with adding polyamine.

For unsaturated bisimide, such ones as represented by following formula (I) may be employed:

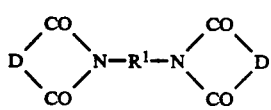
(I)

in which formula (I) D denotes bivalent organic group including double bond between carbon-carbon, and $R^1$ denotes bivalent organic group containing at least two carbon atoms.

Here, $R^1$ is either one of linear chain or branched alkylene group having less than 13 carbon atoms, cyclic alkylene group having in the ring 5 or 6 carbon atoms, heterogeneous cyclic group including at least one of O, N and S atoms, or phenylene or polycyclic aromatic group. These groups may be ones having a substituent group which causes no unnecessary secondary reaction under required reaction conditions. Further, $R^1$ may represent many phenylene groups and/or groups having a cycloaliphatic group. In this case, adjacent ones of the phenylene group or cycloaliphatic group may include, other than the ones directly bound, ones which are bound through such bivalent atoms as oxygen or sulfur, or ones which are bound through alkylene group of 1 to 3 carbon atoms or one selected from a group consisting of bivalent groups represented by following formulas. In the event where these atoms or groups are present in a plurality, they may be mutually identical or different.

$-NR^4-$, $-P(O)R^5-$, $-N=N-$, $-N=N-$
$\quad\quad\quad\quad\quad\quad\quad\quad\quad\quad\quad\quad\quad\quad\quad\quad\downarrow$
$\quad\quad\quad\quad\quad\quad\quad\quad\quad\quad\quad\quad\quad\quad\quad\quad O$ $-CO-O-$, $-SO_2-$, $-SiR^5R^4-$ $-CONH-$, $-NY-CO-X-CO-NY-$, $-O-CO-X-CO-O-$,

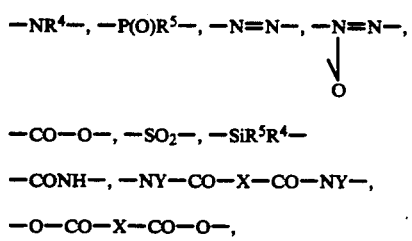

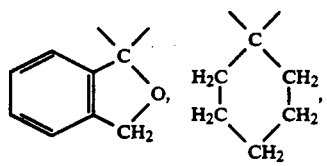

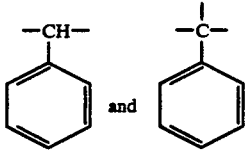

in which $R^4$, $R^5$ and Y represent respectively alkyl group of 1 to 4 carbon atoms, cyclic alkyl group having in the ring 5 or 6 carbon atoms, or phenyl or polycyclic aromatic group, and X denotes linear-chain or branched alkylene group having less than 13 carbon atoms, cyclic alkylene group having in the ring 5 or 6 carbon atoms, or monocyclic or polycyclic allylene group.

The group D is the one derived from an ethylene series anhydride represented by a following formula (III):

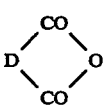
(III)

It may be, for example, maleic anhydride, cytraconic anhydride, tetrahydrophthalic anhydride, itaconic anhydride, and a product of Diels-Alder reaction occurring between cyclodiene and one of these anhydrides.

For preferable unsaturated bisimide to be employed in the above formula (I), there may be enumerated such ones as follows:

N,N'-ethylene-bisimide maleate,
N,N'-hexamethylene-bisimide maleate,
N,N'-methaphenylene-bisimide maleate,
N,N'-para-phenylene-bisimide maleate,
N,N'-4,4'-diphenylmethane-bisimide maleate (also called generally N,N'-methylene-bis=N-phenyl-maleimide),
N,N'-4,4'-diphenylether-bisimide maleate,
N,N'-4,4'-diphenylsulfone-bisimide maleate,
N,N'-4,4'-dicyclohexylmethane-bisimide maleate,
N,N'-α,α'-4,4'-dimethylenecyclohexane-bisimide maleate,
N,N'-metaxylene-bisimide maleate, and
N,N'-diphenylcyclohexane bisimide maleate.

For diamine, the one which is represented by a following formula (II) may be employed:

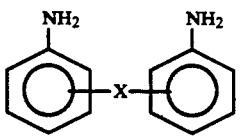
(II)

In the above formula, $X=CH_2$, O, S, or $SO_2$.

For preferable diamine to be employed as represented by the above formula (II), there may be enumerated such ones as
diaminodiphenylmethane,
diaminodiphenyl oxide,
diaminodiphenyl sulfide,
diaminodiphenyl sulfone
and the like.

Further, in the present invention, composition ratio of unsaturated bisimide and diamine should be in a range of 0.25 to 0.43mol of diamine with respect of 1.0mol of unsaturated bisimide. When diamine is less than 0.25mol, it becomes likely that the unreacted bisimide component toxic to the human body remains so as to be separated out to be precipitated while the obtained prepolymer is being preserved in an aspect of solution. While in this event the reaction may be proceeded in order to have the unreacted bisimide less produced, this will cause the homo polymer of bisimide to be produced to render the component of the molecular weight exceeding 15,000 to be increased. When diamine is increased to exceed the above range, on the other hand, it becomes difficult to reduce residual diamine amount. The composition ratio of diamine should preferably be, in particular, in a range of 0.25 to 0.35mol with respect to 1.0mol of unsaturated bisimide.

The foregoing composition ratio is the final mol ratio, and one or both of unsaturated bisimide and diamine may be employed as divided to be more than 1 lump. While reaction temperature should vary in accordance with melting point, solubility and so on of the material, it should be preferable that the reaction is carried out at a relatively lower temperature below 150° C. Such reaction is to be carried out in a range of, normally, 2 minutes to 10 hours, whereas a concrete reaction time should be selected properly in accordance with the type of the material and its mode of, reaction or, in the event of solution reaction, additionally the type of polar solvent, its concentration and reaction temperature, and it may be possible that the reaction time is out of the above range. While in the present invention the high polymer component normally increases as the reaction proceeds, the reaction is stopped so that any component of the molecular weight exceeding 15,000 will be in a range of not more than 5wt.% as analyzed by means of the gel permeation chromatography (which shall be hereinafter referred to simply as "GPC"), whereby a required viscosity for varnishing can be ensured, the amount of diamine can be sufficiently reduced, and a proper gelation time required for further fabrication and the like can be attained.

Here, the molecular weight distribution has been measured with DMF (or d-DMF) solvent employed and by means of GPC (HLC-803D made by TOYO SODA) with two separating columns (AD-803S by SHOWA DENKO, 8.3x250mm, theoretical step number 6,000) mounted. A measure taken for calculating the molecular weight has been to obtain a regression curve of tertiary formula from retention time and working logarithm of five different monodisperse polyethylene glycol and ethylene glycol monomer and to reversely obtain the molecular weight from the retention time of a sample to which the regression curve has been applied. For the ratio of the respective components, there has been taken a measure of employing a differential refractometer ($128 \times 10^{-8}$ RI unit), carrying out the measurement with the sample concentration made to be $0.5 \pm 0.2$wt.% and the sample pour to be 100 µl, dividing into required molecular weight sections a chromatography obtained with the refractometer output made to be 0 to 1 V, an output to a recorder to be 0 to 10mV and chart speed to be 5mm/minute, and obtaining the ratio by means of a cutting gravimetric method.

On the other hand, polyamine is added to a product of the reaction of unsaturated bisimide and diamine, in which event a reaction of polyamine may also be carried out. More specifically, the reaction has to be advanced to a considerable extent in order to reduce remaining diamine in unreacted state, but it becomes likely that the homo polymer of unsaturated bisimide is produced as the reaction advances so as to increase the component exceeding the molecular weight of 15,000, and the gel time of the varnish and prepreg obtained through the reaction is caused to be shortened to cause a problem to arise in respect of the moldability. The problem may be overcome by an addition of polyamine to the reaction product of unsaturated bisimide and diamine. Polyamine used here may not be particularly limited so long as the same has at least three benzene rings, but the ones which are represented, for example, by a following formula (IV) may be enumerated:

$$[N\,H_2\!\!+\!\!_n R^2] \qquad (IV)$$

in which formula (Iv), $R^2$ represents n valent organic group having at least three benzene rings, n being an integer more than 1.

Amine having more than three benzene rings is generally considered to be of a low toxicity since the same does not easily pass through the biologic cell membrane, and the ones having more than three benzene rings so as to be of the low toxicity should preferably be employed as polyamine. There can be enumerated as optimum polyamine such ones as
bis(aminobenzyl)benzene,
bis(aminophenoxy)benzene,
bis(aminophenoxy)propane,
bis[(aminophenoxy)phenyl]sulfone,
bis(aminophenyl)diphenylsilane,
bis(aminophenyl)phenyl phosphone oxide,
bis(aminophenoxy)diphenyl,
a polymer with one of the above made as a skeleton,
aniline resin having only components of a molecular weight more than 303
and the like.

While the composition ratio of the foregoing polyamine is not specifically limited, a desirable ratio will be 0.07 to 0.25mol or, particularly preferably, 0.1 to 0.2mol with respect to 1.0mol of unsaturated bisimide. It is also preferable that polyamine is added so that entire amine component will be in a range of 0.33 to 0.5mol with respect to 1.0mol of unsaturated bisimide. In the event where polyamine is out of the above range of 0.07 to 0.25mol, there is a risk that the eventually obtained resin is impaired in the heat resistance and adhesion.

Further, while polyamine may be added during the reaction between unsaturated bisimide and diamine, it is desirable that polyamine is added after completion of the reaction between unsaturated bisimide and diamine when the reduction of diamine component is taken into consideration. In order that the production of any component of the molecular weight exceeding 15,000 can be concurrently restrained with the reduction of the unreacted diamine, it is further preferable that a catalyst is employed upon the reaction between unsaturated bisimide and diamine.

For the catalyst employed here, there may be enumerated oxalic acid, ammonium salt, thiocyanic acid, thiocyanate, isothiocyanic acid and isothiocyanate, which may be employed alone or in a combination of two or more.

For ammonium salt, more concretely, there may be enumerated ammonium salts of such organic acid as succinic acid, latic acid, formic acid, acetic acid, butyric acid, phthalic acid, citric acid, tartaric acid, tartrate hydroacid, maleic acid, fumaric acid, benzoic acid and the like and ammonium salts of such inorganic acid as carbonic acid, hydroacidic carbonate, boric acid and the like, which may be employed alone or in a combination of two or more.

Thiocyanate is a compound having a general formula of $R^6$-SCN, which including ones in which $R^6$ is such organic substituting group as ethyl group, methyl group, phenyl group or the like (thiocyanic acid ester or its derivative), ones in which $R^6$ is such a metal as potassium, calcium, silicon, cobalt, iron, copper, magnesium or the like (metallic salt thiocyanate), and ones in which $R^6$ is such cation other than metals as ammonium ion. More concretely, for example, methyl thiocyanate, ethyl thiocyanate, ethylene thiocyanate, phenyl thiocyanate, potassium thiocyanate, calcium thiocyanate, silicon thiocyanate, cobalt thiocyanate, iron thiocyanate, copper thiocyanate, magnesium thiocyanate, ammonium thiocyanate, chloromethyl thiocyanate and the like can be enumerated, which may be employed alone or in a combination of two or more.

Isothiocyanate is a compound having a general formula of $R^6$-NCS, which including ones in which $R^6$ is such organic substituting group as ethyl group, methyl group, phenyl group or the like (ester isothiocyanate or its derivative), ones in which $R^6$ is such metal as potassium, calcium, silicon, cobalt, iron, copper, magnesium or the like (metallic salt isothiocyanate) and ones in which $R^6$ is such cation other than metal as ammonium ion or the like. More concretely, there may be enumerated methyl isothiocyanate, ethyl isothiocyanate, allyl isothiocyanate, isoamyl isothiocyanate, isopropyl isothiocyanate, n-propyl isothiocyanate, phenyl isothiocyanate, benzyl isothiocyanate, nitrophenyl isothiocyanate, ammonium isothiocyanate and the like, which may be employed alone or in a combination of two or more.

For the amount of addition of catalyst, though not to be particularly limited, it is preferable that the amount is in a range of 0.05 to 7.0 weight wt.% or, optimumly, 0.1 to 5.0 weightwt.%, with respect to the total weight of unsaturated bisimide and diamine. When the added amount of catalyst is less than 0.05 wt.wt.%, there arises a risk that the Michael addition is not promoted and, when the amount exceeds the upper limit, it becomes difficult to stop the reaction at the optimum prepolymer stage.

While the mode of the reaction between unsaturated bisimide and diamine is not required to be particularly limited in obtaining the addition type imide resin prepolymer according to the present invention, one of such reactions as hot-melting reaction, solution reaction and the like may be selectively carried out.

In the case of the solution reaction, it is preferable to use as the solvent alkylene glycol monoalkyl ether and concurrently at least one selected from N,N-dimethylformamide, N,N-dimethylacetamide and N-methyl-2-pyrrolidone. Alkylene glycol monoalkyl ethers having OH group achieve an action of promoting the Michael's addition in the reaction between unsaturated bisimide and diamine, and are effective to reduce unreacted diamine and to restrain the production of the component of the molecular weight exceeding 15,000. For such alkylene glycol monoalkyl ethers, there may be enumerated, for example, ethylene glycol monomethyl ether, ethylene glycol monoethyl ether, propylene glycol monomethyl ether, propylene glycol mono-n-propyl ether, ethylene glycol mono-n-propyl ether, ethylene glycol mono-i-propyl ether and the like, which may be employed alone or in a combination of two or more.

Further, alkylene glycol monoalkyl ethers are generally deficient in the solubility of unsaturated bisimide and it is likely that unsaturated bisimide separates to be precipitated while the obtained prepolymer is being preserved in the form of solution. In order to complement the solubility, therefore, at least one selected from N,N-dimethylformamide, N,N-dimethylacetamide and N-methyl-2-pyrrolidone is used concurrently with alkylene glycol monoalkyl ether as the foregoing solvent, so that the problem of the separation and precipitation may be overcome.

Mixing ratio of the above solvents is to be optimumly determined in accordance with the type of the material, reaction time and temperature, solid component concentration, the material used, and type, amount and the like of the catalyst added, and is not to be particularly limited.

In the addition type imide resin prepolymer obtained according to the present invention in such arrangement as in the above, the amount of unreacted diamine is kept to be extremely low and any component of the molecular weight exceeding 15,000 can be restrained to be less than 5wt.%. Here, the ratio of unreacted diamine with respect to solids content has been calculated in such that soluble content to acetonitrile of the prepolymer was analyzed by means of a liquid chromatography and unreacted diamine was determined from peak area of calibration curve preliminarily obtained and converted into the ratio with respect to solids contents. In this case, a reverse phase distribution type column ODS80T (by a Japanese manufacturer TOSOH) was used, and the measurement was carried out with acetonitrile/hydrogen solvent used as an eluting solution. These measuring conditions are shown just as an example, and the conditions are to be properly modified in accordance with the type of diamine to be determined.

Prior to the determination, the GPC measurement was carried out with respect to the residue of acetonitrile extraction of the prepolymer, but unreacted material peak was not recognized in the extracted residue, and the unreacted material was all extracted into acetonitrile.

While the addition type imide resin prepolymer produced through the foregoing manufacturing method according to the present invention should be found to be extremely useful when employed in the multilayered wiring substrate for use as the printed wiring board, the prepolymer may be made applicable, when properly combined with various fillers, to such a wide variety of use as semiconductor sealing material, structural material of high strength and high elasticity modulus for use in electrical devices and equipments, molding material for microwave shielding members, adhesive agent for die bond for semiconductor elements and chip parts mounting purpose, circuit printing paste, and so on, and excellent high heat resistance, adhesion and flexibility are shown when employed for these purposes.

According to another feature of the present invention, the addition type imide resin prepolymer as has been disclosed is employed, as it is, as a resin varnish in such that a base material is impregnated with the particular resin varnish, thereafter the varnish is made to reach B-stage from A-stage by carrying out a secondary reaction or an operation for evaporation of the solvent, and a prepreg in a half-cure state is obtained. More specifically, the prepreg attainable in accordance with the present invention is made less in the unreacted diamine than that of the prepolymer, and the resin varnish with which the base material for the prepreg is impregnated is made to be less than 10wt.%, preferably, in the component of the molecular weight exceeding 15,000. That is, when the impregnating resin varnish contains more than 10wt.% of the component the molecular weight of which exceeding 15,000, the resin varnish becomes higher in the viscosity, whereby any bubbles generated during the molding are made uneasy to escape so as to cause voids to be generated. Further, required time until the setting is excessively shortened, and it becomes difficult to obtain a large size molded plate. Even when the component of the molecular weight exceeding 15,000 is less than 10wt.%, on the other hand, the unreacted component exceeding 35wt.% causes the molding to often involve a so called oozing of the resin so that, in particular, the multilayered wiring substrate of the printed wiring boards will be caused to involve a fluctuation in the thickness of board. It will be readily appreciated here that, in the prepreg of the present invention, the reduction of the unreacted diamine renders the viscosity of the resin varnish to be relatively low, the bubbles to easily escape and the required setting time to be proper so that high quality products of the prepolymer can be provided.

In preparing the prepreg according to the present invention, the type of the base material to be impregnated with the resin varnish of the addition type imide resin prepolymer is not particularly limited. While glass cloth is employed normally, it is also possible to use such inorganic fiber cloth as quartz fiber cloth and the like, such highly heat-resisting fiber cloth as aromatic polyamide fiber (aramide fiber, such as Kevler, a product of Du Pont and the like) cloth and the like. The base material is normally employed as subjected to a surface treatment by means of a coupling agent or the like. In half-setting the resin for the prepreg preparation, it is preferable that the temperature to which the prepreg reaches is made in a range of 130°–175° C., since the temperature higher than 175° C. shows a tendency that the production of the components of the molecular weight exceeding 15,000 to be promoted, whereas the temperature lower than 130° C. does not allow the prepregs to be produced at a higher efficiency.

According to still another feature of the present invention, a laminate can be formed with the foregoing prepregs stacked and molded. In stacking them, a copper, nickel or the like metal foil or an inner layer member carrying a circuit pattern will be employed as required, and such a laminate as a printed wiring board or the like is prepared through any known method. Since the laminate according to the present invention retains such advantages as has been referred to with reference to the addition type prepolymer and prepreg as they stand, the laminate is high in the heat-resistance and adhesive properties, without causing any blister or the like produced, and allows the printed wiring board of a high quality for a high density mounting to be realized.

The present invention shall now be described with reference to concrete examples of the invention in the followings in comparison with some comparative examples, while the invention should not be limited only to these examples.

EXAMPLES 1-7

Materials listed in the column of "Raw Material Composition" in Table 1 were prepared in such amount as given in respective columns of Examples 1-7 in the table, they were placed in a three neck flask of a volume of 3 lit., a stirring rod, thermometer and cooler were mounted to the flask, nitrogen gas was substituted for air within the flask, and thereafter a heating was initiated with an oil bath. Upon dissolving of the materials, their stirring was started, and the "Reaction Temperature" shown in Table 1 was set. After continuation of the stirring for the "Reaction Time" shown in Table 1, a mixture of the material was cooled down by means of a water bath for 20 minutes to be at the room temperature, polyamine was thereafter added in the amount listed in Table 1, and a solution of addition type imide resin prepolymer was obtained.

COMPARATIVE EXAMPLES 1-4

Materials listed in the column of "Raw Material Composition" in Table 1 were prepared in such amount as given in respective columns of Comparative Examples 1-4 in the table, and a solution of prepolymer was obtained in the same manner as in the above Examples 1-7.

EXAMPLE 8

Materials listed in the "Raw Material Composition" also in Table 1 were placed in a container of a stainless steel heated sufficiently by an electric heater, while keeping the heating state, within a period substantially of 2 minutes spent. Upon dissolving of the materials, they were stirred and caused to react at such temperature and for such time as shown in Table 1. Thereafter, they were cooled by spreading them to be thin, within a period substantially of 1 minute spent, over a wide iron plate, and a prepolymer was thus obtained. The prepolymer was then crushed within a mortar, crushed prepolymer was then dissolved in N,N-dimethylformamide warmed to be substantially at 40° C, thereafter such polyamine as shown in Table 1 was added, and a prepolymer solution was obtained.

Analyzed values and characteristic values of these prepolymers, that is, resin varnishes obtained through such Examples 1-8 and Comparative Examples 1-4 as referred to in the above are shown in Table 2.

Unsaturated bisimide, diamine and polyamine shown in Table 1 will be represented concretely by such chemical formulas as follows.

N,N'-methylene-bis(N-phenyl maleimide) as the unsaturated bisimide:

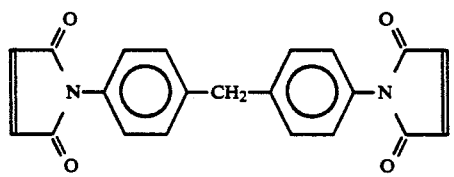

4,4'-diaminodiphenylmethane as diamine:

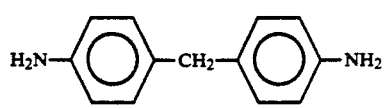

"A-110" (by a Japanese manufacturer MITSUI TOATSU KAGAKU) as polyamine:

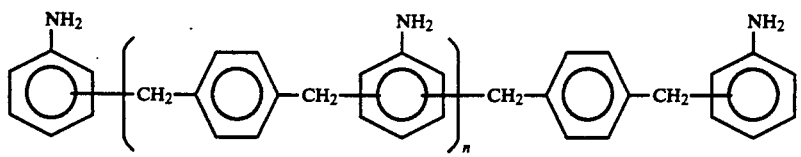

Equivalent weight of amine: 0.63eq/100g
"A-13" (by MITSUI TOATSU KAGAKU) as polyamine:
Its chemical formula is the same as "A-110" above.
Equivalent weight of amine: 0.62eq/100g
"MC-810" (by a Japanese manufacturer MITSUBISHI YUKA):

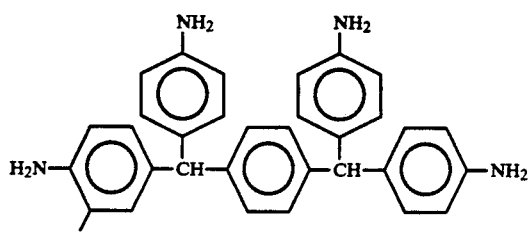

-continued

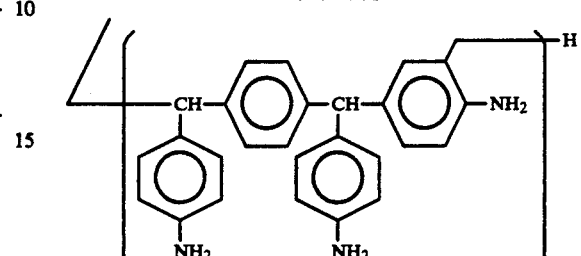

Equivalent weight of amine: 0.79eq/100g.
2,2-bis[4-(4-aminophenoxy)phenyl]propane ("BAPP" by MITSUI TOATSU KAGAKU):

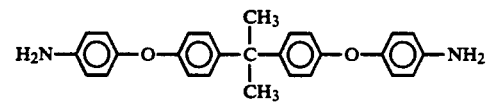

TABLE 1

| Raw Material Composition of Impreg. Prepolymer Varnish: | EXAMPLES | | | | | | | | COMP. EXAMPLES | | | |
|---|---|---|---|---|---|---|---|---|---|---|---|---|
| | 1 | 2 | 3 | 4 | 5 | 6 | 7 | 8 | 1 | 2 | 3 | 4 |
| Unsaturated bisimide (N,N'-methylene-bis) | 1181 | 1070 | 1070 | 1070 | 1153 | 1432 | 833 | 1074 | 1611 | 788 | 716 | 716 |
| Diamine (4,4'-diaminodiphenylmethane) | 198 | 198 | 198 | 198 | 198 | 198 | 198 | 198 | 198 | 198 | 198 | 198 |
| Solvent: | | | | | | | | | | | | |
| diethylene glycol monomethyl ether | 729 | 372 | 372 | 521 | 79 | 79 | 550 | 0 | 956 | 0 | 483 | 546 |
| dimethylformamide | 81 | 0 | 0 | 223 | 0 | 0 | 137 | 747 | 160 | 0 | 54 | 61 |
| dimethylacetamide | 0 | 372 | 0 | 0 | 714 | 714 | 0 | 0 | 0 | 579 | 0 | 0 |
| N-methyl-2-pyrrolidone | 0 | 0 | 372 | 0 | 0 | 0 | 0 | 0 | 0 | 0 | 0 | 0 |
| Catalyst: | | | | | | | | | | | | |
| thiocyanic acid ethyl | 0 | 13 | 0 | 0 | 0 | 13 | 0 | 0 | 0 | 0 | 0 | 25 |
| isothiocyanic acid ethyl | 0 | 0 | 26 | 0 | 0 | 0 | 0 | 0 | 0 | 0 | 0 | 0 |
| ammonium acetate | 0 | 0 | 0 | 13 | 0 | 13 | 0 | 0 | 0 | 0 | 0 | 0 |
| oxalic acid | 0 | 0 | 0 | 0 | 41 | 0 | 31 | 25 | 0 | 0 | 27 | 0 |
| Polyamine (avg. mol wt.) | | | | | | | | | | | | |
| A-110 (317) | 159 | 0 | 0 | 0 | 127 | 0 | 52 | 0 | 120 | 0 | 0 | 317 |
| A-13 (323) | 0 | 97 | 0 | 0 | 0 | 323 | 0 | 0 | 0 | 32 | 0 | 0 |
| MC-810 (253) | 0 | 0 | 76 | 0 | 0 | 0 | 0 | 127 | 0 | 0 | 0 | 0 |
| BAPP (380) | 0 | 0 | 0 | 123 | 0 | 0 | 0 | 0 | 0 | 0 | 0 | 0 |
| Mol Ratio with respect to per 1.0 mol of unsaturated bisimide: | | | | | | | | | | | | |
| Diamine | 0.30 | 0.34 | 0.34 | 0.34 | 0.31 | 0.25 | 0.43 | 0.33 | 0.22 | 0.45 | 0.50 | 0 |
| Polyamine | 0.15 | 0.10 | 0.10 | 0.10 | 0.12 | 0.25 | 0.07 | 0.17 | 0.08 | 0.05 | 0 | 0.50 |
| Reaction Temperature (°C.) | 90 | 80 | 80 | 80 | 80 | 80 | 80 | 130 | 90 | 90 | 80 | 120 |
| Reaction Time (minute) | 300 | 180 | 120 | 180 | 150 | 180 | 180 | 10 | 300 | 300 | 180 | 180 |

TABLE 2

| | EXAMPLES | | | | | | | | COMP. EXAMPLES | | | |
|---|---|---|---|---|---|---|---|---|---|---|---|---|
| | 1 | 2 | 3 | 4 | 5 | 6 | 7 | 8 | 1 | 2 | 3 | 4 |
| Component of mol wt. exceeding 15000 (wt. %) (*1) | 1.5 | 3.4 | 2.6 | 2.9 | 2.1 | 3.1 | 1.5 | 4.2 | 4.2 | 6.9 | 3.0 | 7.2 |
| Unreacted diamine (*2) | 0.45 | 0.52 | 0.40 | 0.53 | 0.42 | 0.39 | 0.60 | 0.55 | 0.39 | 3.52 | 2.51 | 0 |
| Stability at 25° C. (*3) | G | G | G | G | G | G | G | G | B | G | G | G |

TABLE 2-continued

|  | EXAMPLES | | | | | | | | COMP. EXAMPLES | | | |
| --- | --- | --- | --- | --- | --- | --- | --- | --- | --- | --- | --- | --- |
|  | 1 | 2 | 3 | 4 | 5 | 6 | 7 | 8 | 1 | 2 | 3 | 4 |
| Reqd. time for gelatinization at 170° C. (min.) | 15 | 12 | 9 | 12 | 10 | 12 | 8 | 9 | 20 | 13 | 5 | 10 |

Notes:
(*1) Ratio of peak area in the foregoing GPC measurement
(*2) Conversion of the value obtained through the foregoing liquid chromatography into solid constituent (wt. %) with respect to the resin.
(*3) Stability of the respective resin solutions when they were left on shelf at 25° C., as discriminated by the presence or absence of deposition of solid matter in the solution, "G" representing good stability for more than seven days and "B" representing the deposition of solid matter within one day.

From the above Table 2, it has been found that the prepolymers of Examples 1-8 contain less retention of unreacted diamine and show better preservation stability than those of Comparative Examples 1-4. That is, the prepolymer of Comparative Example 1 is defective in the stability at 25° C., the prepolymer of Comparative Example 2 is remarkable in the component of the molecular weight exceeding 15,000 and in unreacted diamine, the prepolymer of Comparative Example 3 is remarkable in the amount of unreacted diamine and short in the required time for the gelation, and Comparative Example 4 shows much component of the molecular weight exceeding 15,000.

EXAMPLES 9-16

Surface treated glass cloth of 105g/m² was impregnated with each of the prepolymer solutions of the respective Examples 1-8. Thus impregnated glass cloths were dried within a drier at such drying temperature as shown in following Table 3 to carry out a secondary reaction and evaporation of the solvent, and prepregs of resin content of 47-50wt.% were obtained.

Drying conditions and respective characteristics of the prepregs were as also shown in Table 3.

COMPARATIVE EXAMPLE 5-8

With the prepolymer solutions obtained through the foregoing Comparative Examples 1-4 employed, prepregs were obtained in the same manner as in Examples 9-16.

Drying conditions and respective characteristics of the prepregs were also as shown in Table 3.

TABLE 3

| Material & solid state properties of prepregs | EXAMPLES | | | | | | | | COMP. EXAMPLES | | | |
| --- | --- | --- | --- | --- | --- | --- | --- | --- | --- | --- | --- | --- |
|  | 9 | 10 | 11 | 12 | 13 | 14 | 15 | 16 | 5 | 6 | 7 | 8 |
| Example or Comp. Example No. of prepreg employed | 1 | 2 | 3 | 4 | 5 | 6 | 7 | 8 | 1 | 2 | 3 | 4 |
| Drying Temp. (°C.) | 150 | 150 | 150 | 150 | 160 | 150 | 150 | 150 | 150 | 150 | 150 | 150 |
| Resin Properties: | | | | | | | | | | | | |
| Component of mol. wt. exceeding 15000 (*1) | 5.2 | 7.5 | 6.4 | 7.2 | 6.8 | 7.8 | 6.1 | 8.3 | 11.0 | 12.5 | 7.9 | 19.5 |
| Amount of unreacted component in prepreg resin (wt %/solid constituent) | 30.1 | 32.7 | 31.5 | 34.3 | 34.0 | 28.7 | 28.7 | 27.6 | 37.2 | 20.1 | 21.6 | 18.6 |
| Unreacted diamine (wt. %) (*2) | 0.15 | 0.16 | 0.13 | 0.16 | 0.14 | 0.12 | 0.19 | 0.17 | 0.12 | 1.51 | 1.02 | 0 |
| Reqd. time for gelation (min.) | 10 | 7 | 5 | 7 | 5 | 7 | 5 | 5 | 15 | 8 | 1 | 5 |

NOTES:
(*1) Ratio of peak area in the foregoing GPC measurement.
(*2) Conversion of the value obtained through the foregoing liquid chromatography into solid constituent (wt. %) with respect to the resin.

From the above Table 3, it has been found that the prepregs according to Examples 9-16 contain less component of the molecular weight exceeding 15,000 than in the case of the Comparative Examples 5-8 and less retention of unreacted diamine, and are made longer in the gelation time. On the other hand, the prepreg of Comparative Example 5 is remarkable in the component of molecular weight exceeding 15,000 and also in the amount of unreacted diamine, the prepreg of Comparative Example 7 is remarkable in the unreacted diamine amount and is very short in the gelatinization time, and the prepreg of Comparative Example 8 is very large in the component of molecular weight exceeding 15,000.

EXAMPLES 17-24

The prepregs obtained through the foregoing Examples 9-16 were cut into a size of 50×50cm, four sheets of which were stacked into a stack with a copper foil of ½ oz/ft² placed on both surfaces of the stack. The thus formed stack was held between a pair of molds 1.6mm thick, heated immediately up to 130° C. while applying a pressure of 5kg/cm² by means of a steam press and retained as they stand for 20 minutes. Thereafter, the pressure was elevated to 15kg/cm² and the temperature was raised to 170° C. After being left as they stand for 90 minutes, the stack was cooled down to the room temperature while applying the pressure, and thereafter the molded stack was taken out of the molds. The molded stack was further heated at 200° C. for 2 hours to be subjected to a post handling, and various laminates were thereby obtained with the respective prepregs of Examples 9-16.

Properties of the thus obtained laminates were as shown in Table 4, in which a peeling strength was given by the adhesiveness shown upon peeling one of the stacked prepreg sheets off from another in a direction of 90 degrees, and an oven heat resistance was shown by a state after being left for 1 hour in an atmosphere at 280° C.

COMPARATIVE EXAMPLES 9-12

Laminates were obtained in the same manner as in Examples 17-24 with the respective prepregs of the foregoing Comparative Examples 5-8 employed. The peeling strength and oven heat resistance measurements obtained in the same manner as in Examples 17-24 with respect to these laminates were as shown also in Table 4.

TABLE 4

|  | EXAMPLES |  |  |  |  |  |  |  | COMP. EXAMPLES |  |  |  |
|---|---|---|---|---|---|---|---|---|---|---|---|---|
|  | 17 | 18 | 19 | 20 | 21 | 22 | 23 | 24 | 9 | 10 | 11 | 12 |
| Example or Comp. Example No. of prepreg employed | 9 | 10 | 11 | 12 | 13 | 14 | 15 | 16 | 5 | 6 | 7 | 8 |
| Peeling Strength (kg/cm$^2$) | 1.54 | 1.50 | 1.49 | 1.48 | 1.50 | 1.46 | 1.58 | 1.42 | 1.25 | 1.40 | 1.36 | 1.19 |
| Oven heat resist. (1 hr. at 280° C.) | G | G | G | G | G | G | G | G | G | G | B | B |

In the above, "G" denotes good state with no variation, and "B" denotes a state in which blisters have occurred.

From the above Table 4, it has been found that the respective laminates of Examples 17-24 are higher in the peeling strength and in the oven heat resistance than these of the Comparative Examples 9-12.

What is claimed is:

1. A method for manufacturing an addition imide resin composition, comprising the steps of (a) reacting an unsaturated bisimide and a diamine in a solvent solution comprising an alkylene glycol monoalkylether and at least one solvent selected from the group consisting of N,N-dimethylformamide, N,N-dimethylacetoamide and N-methyl-2-pyrrolidone, thereby forming a mixture which includes a reaction product and unreacted diamine, wherein the reaction is stopped at a point no later than that which results in the formation of about 5% of the polymeric component in said mixture having a molecular weight of greater than about 15,000 (b) thereafter adding to said mixture a polyamine having at least three benzene rings in an amount sufficient to substantially inhibit the formation of bisimide homopolymer and simultaneously inhibit the formation of polymeric components having a molecular weight of greater than about 15,000 (c) further reacting the mixture from step (b) to react at least a portion of the unreacted diamine from step (a), thereby forming the prepolymer; wherein the unsaturated bisimide has the formula

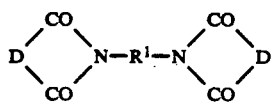

in which D denotes an unsaturated bivalent organic group and R$^1$ is a bivalent organic group containing at least two carbon atoms and wherein the diamine has the formula

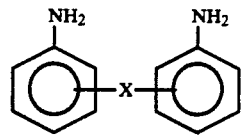

in which X is —CH$_2$—, O, S or SO$_2$,
and wherein the mole ratio of unsaturated bisimide to unreacted diamine in step (a) is from about 1:0.25 to about 1:0.43.

2. The method according to claim 1 wherein said polyamine is added at a ratio of 0.07 to 0.25 mol with respect to said unsaturated bisimide of 1.0 mol.

3. The method according to claim 1 wherein said unsaturated bisimide is one selected from the group consisting of
N,N'-methaphenylene-bisimide maleate,
N-N'-para-phenylene-bisimide maleate,
N,N'-4,4'-diphenylmethane-bisimide maleate (also called N,N'-methylene-bis=N-phenylmaleimide),
N,N'-4,4'-diphenylether-bisimide maleate, and
N,N'-4,4'-diphenylsulfone-bisimide maleate.

4. The method according to claim 1 wherein said diamine is one selected from the group consisting of
diaminodiphenylmethane,
diaminodiphenyl oxide,
diaminodiphenyl sulfide, and
diaminodiphenyl sulfone.

5. The method according to claim 1 wherein said polyamine is one selected from the group consisting of
bis(aminobenzyl)benzene,
bis(aminophenoxy)benzene,
bis[(aminophenoxy)phenyl]propane,
bis[(aminophenoxy)phenyl]sulfone,
bis(aminophenyl)diphenylsilane,
bis(aminophenyl)phenyl phosphone oxide,
bis(aminophenoxy)diphenyl, and
a polymer with one of the above made as a skeleton.

6. The method of claim 1, wherein the reaction between unsaturated bisimide and diamine is carried out in the presence of at least one catalyst selected from the group consisting of oxalic acid, ammonium salt, thiocyanic acid, thiocyanate, isothiocyanic acid and isothiocyanate.

7. The method according to claim 1 wherein the mole ratio of unsaturated bisimide to unreacted diamine in step (a) is from about 1:0.25 to about 1:0.35.

8. The method according to claim 2 wherein the mole ratio of unsaturated bisimide to unreacted diamine in step (a) is from about 1:0.25 to 1:0.35.

9. The method according to claim 1 wherein said polyamine is added in an amount such that the total amine content in the prepolymer is within the range of 0.33 to 0.5 mole per mole of unsaturated bisimide.

10. The method according to claim 2 wherein said polyamine is added in an amount such that the total amine content in the prepolymer is within the range of 0.33 to 0.5 mole per mole of unsaturated bisimide.

* * * * *